United States Patent
Do et al.

(10) Patent No.: US 9,398,732 B2
(45) Date of Patent: Jul. 19, 2016

(54) POWER SUPPLYING MEANS HAVING SHIELDING MEANS FOR FEEDING LINE AND SUBSTRATE PROCESSING APPARATUS INCLUDING THE SAME

(75) Inventors: Jae-Chul Do, Daegu (KR); Bu-Il Jeon, Gyeonggi-do (KR); Myung-Gon Song, Jeollanam-do (KR); Jung-Rak Lee, Gyeonggi-do (KR)

(73) Assignee: JUSUNG ENGINEERING CO., LTD. (KR)

( * ) Notice: Subject to any disclaimer, the term of this patent is extended or adjusted under 35 U.S.C. 154(b) by 1069 days.

(21) Appl. No.: 13/174,529

(22) Filed: Jun. 30, 2011

(65) Prior Publication Data

US 2012/0000609 A1   Jan. 5, 2012

(30) Foreign Application Priority Data

Jul. 1, 2010 (KR) .................. 10-2010-0063491

(51) Int. Cl.
| | |
|---|---|
| *C23C 16/50* | (2006.01) |
| *C23C 16/505* | (2006.01) |
| *H01J 37/32* | (2006.01) |
| *H05K 9/00* | (2006.01) |

(52) U.S. Cl.
CPC ........ *H05K 9/00* (2013.01); *C23C 16/50* (2013.01); *C23C 16/505* (2013.01); *H01J 37/3244* (2013.01); *H01J 37/32091* (2013.01); *H01J 37/32532* (2013.01); *H01J 37/32568* (2013.01); *H01J 37/32577* (2013.01)

(58) Field of Classification Search
CPC .............. H01J 37/32082; H01J 37/32091; H01J 37/32541; H01J 37/32568; H01J 37/32577; H01J 37/32431; H01J 37/3244; H01J 37/32532–37/32614; H01J 9/00; C23C 16/50; C23C 16/503; C23C 16/505; C23C 16/45565; C23C 16/509; C23C 16/5096
USPC .............. 118/723 I, 715, 723 E, 723 MP; 136/345.1, 345.33, 345.34, 345.43, 136/345.44
See application file for complete search history.

(56) References Cited

U.S. PATENT DOCUMENTS

| | | | | |
|---|---|---|---|---|
| 1,942,575 | A * | 1/1934 | Shapiro | 336/84 C |
| 2,624,794 | A * | 1/1953 | Gooding | 307/1 |
| 3,862,350 | A * | 1/1975 | Milosavich | 174/366 |
| 4,829,189 | A * | 5/1989 | Goto et al. | 250/492.3 |

(Continued)

FOREIGN PATENT DOCUMENTS

| | | |
|---|---|---|
| EP | 0961307 A2 | 12/1999 |
| KR | 938782 B1 * | 1/2010 |

(Continued)

OTHER PUBLICATIONS

Model MTK-600: RF Manual Impedance Matching System Owner's Manual, Manitou Systems, Inc., 12 South Street, Danbury, CT, US, 2001, pp. 1-15.*

*Primary Examiner* — Parviz Hassanzadeh
*Assistant Examiner* — Stanislav Antolin (57) ABSTRACT

A substrate processing apparatus includes: a process chamber including a chamber lid and a chamber body to provide a reaction space therein; a source electrode in the process chamber; a radio frequency (RF) power source for supplying an RF power to the source electrode; a feeding line connecting the source electrode and the RF power source; and a shielding part wrapping the feeding line to block an electric field.

14 Claims, 9 Drawing Sheets

(56) References Cited

U.S. PATENT DOCUMENTS

| | | | | |
|---|---|---|---|---|
| 4,887,005 A | * | 12/1989 | Rough et al. | 315/111.21 |
| 5,560,776 A | * | 10/1996 | Sugai et al. | 118/723 AN |
| 5,619,103 A | * | 4/1997 | Tobin et al. | 315/111.21 |
| 5,733,511 A | * | 3/1998 | De Francesco | 422/186.05 |
| 6,353,201 B1 | * | 3/2002 | Yamakoshi et al. | 219/121.52 |
| 6,483,719 B1 | * | 11/2002 | Bachman | 361/816 |
| 2002/0140358 A1 | * | 10/2002 | Hao | 315/111.21 |
| 2003/0056901 A1 | * | 3/2003 | Nakano et al. | 156/345.47 |
| 2003/0213434 A1 | * | 11/2003 | Gondhalekar et al. | 118/724 |
| 2005/0023254 A1 | * | 2/2005 | Hayashi et al. | 219/121.43 |
| 2005/0145341 A1 | * | 7/2005 | Suzuki | 156/345.49 |
| 2005/0255255 A1 | * | 11/2005 | Kawamura et al. | 427/569 |
| 2006/0260937 A1 | * | 11/2006 | Miller et al. | 204/298.12 |
| 2008/0044321 A1 | * | 2/2008 | Lee | 422/186.29 |
| 2008/0158851 A1 | * | 7/2008 | Cochrane | 361/818 |
| 2009/0288773 A1 | * | 11/2009 | Bolden et al. | 156/345.33 |
| 2010/0006142 A1 | * | 1/2010 | Li et al. | 136/252 |
| 2010/0095888 A1 | * | 4/2010 | Mori et al. | 118/663 |
| 2010/0206483 A1 | * | 8/2010 | Sorensen et al. | 156/345.34 |
| 2010/0264118 A1 | * | 10/2010 | Jost et al. | 216/67 |
| 2011/0001430 A1 | * | 1/2011 | Ko et al. | 315/111.21 |
| 2011/0120375 A1 | * | 5/2011 | Song et al. | 118/723 E |
| 2011/0135844 A1 | * | 6/2011 | Sorensen et al. | 427/578 |
| 2011/0315320 A1 | * | 12/2011 | Do et al. | 156/345.34 |
| 2012/0100311 A1 | * | 4/2012 | Ito et al. | 427/569 |
| 2013/0255575 A1 | * | 10/2013 | Chang et al. | 118/723.1 |

FOREIGN PATENT DOCUMENTS

| | | | | |
|---|---|---|---|---|
| WO | WO 2008123411 A1 | * | 10/2008 | |
| WO | WO 2009080751 A1 | * | 7/2009 | H01J 37/32 |

* cited by examiner

POWER SUPPLYING MEANS HAVING SHIELDING MEANS FOR FEEDING LINE AND SUBSTRATE PROCESSING APPARATUS INCLUDING THE SAME

This application claims the benefit of Korean Patent Application No. 10-2010-0063491, filed on Jul. 1, 2010, which is hereby incorporated by a reference in its entirety.

TECHNICAL FIELD

The present disclosure relates to a power supplying means having a shielding means for a feeding line, and more particularly, to a power supplying means having a shielding means capable of blocking an electric field between a feeding line and an exterior and a substrate processing apparatus including the power supplying means.

BACKGROUND

In general, a semiconductor device, a display device and a solar cell are fabricated through a depositing process where a thin film is formed on a substrate, a photolithographic process where a thin film is selectively exposed and shielded by a photosensitive material and an etching process where a thin film is selectively removed. Among the fabricating processes, the deposition process and the etching process are performed in a substrate processing apparatus under an optimum vacuum state using a plasma.

In the depositing process and the etching process, it is required to uniformly supply an active process gas or an ionized process gas onto the substrate by a plasma discharge. However, when an integrated plate electrode or a split electrode divided into plurality is used for the plasma discharge, it is difficult to obtain a uniform plasma density in the reaction space due to various factors.

SUMMARY

Accordingly, the present disclosure is directed to a power supplying means having a shielding means for a feeding line and a substrate processing apparatus including the same that substantially obviate one or more of the problems due to limitations and disadvantages of the related art.

An object of the present disclosure is to provide a power supplying means where a shielding means for preventing transmission of an electric field from the feeding line to an exterior or from the exterior to the feeding line is formed to wrap a feeding line connecting a radio frequency (RF) power source and a plasma source electrode and a substrate processing apparatus including the power supplying means.

Another object of the present disclosure is to provide a power supplying means where a circulation space is defined between a feeding line and a shielding means and a circulating means for exhausting a heat radiated from the feeding line is formed for the circulation space and a substrate processing apparatus including the power supplying means.

To achieve these and other advantages and in accordance with the purpose of the present invention, as embodied and broadly described, a substrate processing apparatus includes: a process chamber including a chamber lid and a chamber body to provide a reaction space; a source electrode in the process chamber; a radio frequency (RF) power source supplying an RF power to the source electrode; a feeding line connecting the source electrode and the RF power source; and a shielding means wrapping the feeding line to block an electric field.

In another aspect, a power supplying means for supplying a radio frequency (RF) power to a source electrode in a process chamber includes: an RF power source supplying the RF power to the source electrode; a feeding line connecting the source electrode and the RF power source; and a shielding means wrapping the feeding line to block an electric field.

It is to be understood that both the foregoing general description and the following detailed description are exemplary and explanatory and are intended to provide further explanation of the invention as claimed

BRIEF DESCRIPTION OF THE DRAWINGS

The accompanying drawings, which are included to provide a further understanding of the invention and are incorporated in and constitute a part of this specification, illustrate embodiments of the invention.

In the drawings.

DETAILED DESCRIPTION OF THE PREFERRED EMBODIMENTS

Reference will now be made in detail to embodiments which are illustrated in the accompanying drawings. Wherever possible, similar reference numbers will be used to refer to the same or similar parts.

Figure 1:
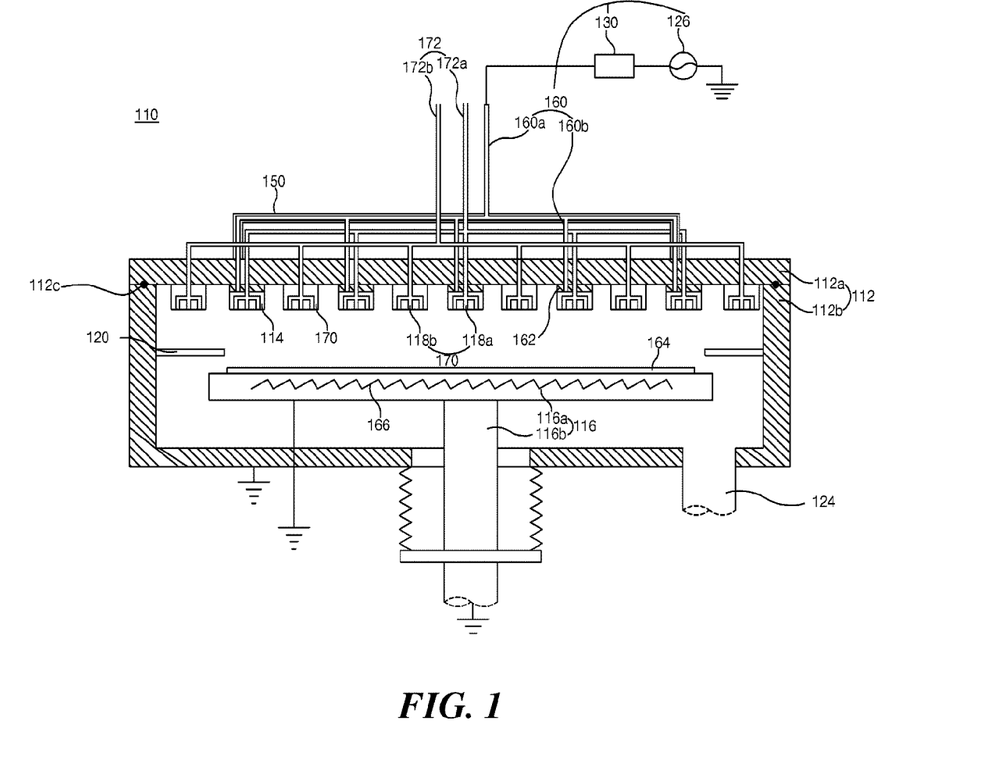
FIG. 1 is a cross-sectional view showing a substrate processing apparatus according to an embodiment of the present invention.

FIG. 1 is a cross-sectional view showing a substrate processing apparatus according to an embodiment of the present invention.

In FIG. 1, a substrate processing apparatus 110 includes a process chamber 112, a plurality of plasma source electrodes 114, a power supplying means 122, a plurality of protruding portions 170, a gas distributing means 118 and a susceptor 116. The substrate processing apparatus 110 may further include a gas inlet pipe 172, an edge frame 120, a gate valve (not shown) and an exhaust port 124.

The process chamber 112 provides a reaction space by combination of a chamber lid 112a and a chamber body 112b.

The chamber lid 112a and the chamber body 112b may be combined to each other with an O-ring 112c interposed therebetween. The plurality of plasma source electrodes 114 used as a source electrode are combined to the chamber lid 112a corresponding to an interior of the process chamber 112. A plurality of insulating plates 162 are formed between the plurality of plasma source electrodes 114 and the chamber lid 112a and electrically insulate the plurality of plasma source electrodes 114 from the chamber lid 112a. The plurality of plasma source electrodes 114 and the chamber lid 112a are combined to each other with the plurality of insulating plates 162 interposed therebetween using a connecting means such as a bolt.

The susceptor 116 is disposed in the process chamber 112 to face the plurality of plasma source electrodes 114 and is used as a plasma ground electrode. In addition, the plurality of protruding portions 170, the chamber lid 112a and the chamber body 112b as well as the susceptor 116 may be used as a plasma ground electrode. A substrate 164 is loaded on the susceptor 116, and the susceptor 116 includes a substrate supporting plate 116a having an area greater than the substrate 164 and a supporting shaft 116b capable of moving the substrate supporting plate 116a. A heater 166 may be formed in the substrate supporting plate 116a for heating up the substrate 164. In the substrate processing apparatus 110, the susceptor 116 may be grounded similarly to the process chamber 112. In another embodiment, an additional radio frequency (RF) power may be applied to the susceptor 116 or the susceptor 116 may have an electrically floating state according to conditions of the process for the substrate 164.

A plasma discharge space is defined between the plurality of plasma source electrodes 114 and the susceptor 116. When a process gas is supplied to the plasma discharge space, the process gas is activated or ionized between the plurality of plasma source electrodes 114 and the susceptor 116 and is supplied onto the substrate 164 on the susceptor 116. As a result, a process for the substrate 164 such as a deposition of a thin film on the substrate 164 or an etching of a thin film on the substrate 164 is performed.

A first gap distance between each plasma source electrode 114 and the susceptor 116 is the same as a second gap distance between each protruding portion 170 and the susceptor 116. Since the plurality of insulating plates 162 are interposed between the chamber lid 112a and each plasma source electrode 114, a first thickness of each plasma source electrode 114 is smaller than a second thickness of each protruding portion 170. In addition, the second thickness of each protruding portion 170 is the same as a sum of the first thickness of each plasma source electrode 114 and a third thickness of each insulating plate 162.

For the purpose of preventing non-uniform process due to a standing wave effect, at least one of the plurality of plasma source electrodes 114 may have a width smaller than a wavelength of an RF wave. As a result, a standing wave effect is prevented by the plurality of plasma source electrodes 114 and a uniform plasma density may be kept in the reaction space.

The power supplying means 122 applying an RF power to each of the plurality of plasma source electrodes 114 includes an RF power source 126 supplying the RF power, a matcher 130 for impedance matching, a feeding line 160 connected to the plurality of plasma source electrodes 114 and a shielding means 150 for the feeding line 160. The plurality of plasma source electrodes 114 are connected in parallel to the RF power source 126, and the matcher 130 for impedance matching is connected between the plurality of plasma source electrodes 114 and the RF power source 126.

The RF power source 126 may use a very high frequency (VHF) wave having a wavelength band of about 20 MHz to about 50 MHz that has excellent plasma generation efficiency. The feeding line 160 includes a main feeding line 160a and a plurality of auxiliary feeding lines 160b. The main feeding line 160a connects the plurality of auxiliary feeding lines 160b to the RF power source 126. The plurality of auxiliary feeding lines 160b penetrate the chamber lid 112a and the plurality of insulating plates 162 and are connected to the plurality of plasma source electrodes 114, respectively. At least one of the plurality of auxiliary feeding lines 160a may be connected to both end portions or a central portion of at least one of the plurality of plasma source electrodes 114.

The plurality of protruding portions 170 are combined to the chamber lid 112a between the two adjacent plasma source electrodes 114. The plurality of plasma source electrodes 114 and the plurality of protruding portions 170 are disposed to be parallel to each other. In addition, the plurality of protruding portions 170 are disposed at a periphery of the chamber lid 112a adjacent to a sidewall of the process chamber 112. Accordingly, the plurality of plasma source electrodes 114 and the plurality of protruding portions 170 are alternately disposed with each other between the two outermost protruding portions 170.

The plurality of protruding portions 170 may be combined to the chamber lid 112a between the two adjacent plasma source electrodes 114 using a connecting means such as a bolt. Alternatively, the plurality of protruding portions 170 may be integrated with the chamber lid 112a as a single body. The chamber lid 112a and the plurality of protruding portions 170 are electrically connected to each other.

The chamber lid 112a may have a rectangular shape and at least one of the plurality of plasma source electrodes 114 may have a stripe shape having longer and shorter axes. The plurality of plasma source electrodes 114 may be disposed to be parallel to each other and spaced apart from each other by the same gap distance. Similarly, at least one of the plurality of protruding portions 170 may have a stripe shape having longer and shorter axes, and the plurality of protruding portions 170 may be disposed to be parallel to each other and spaced apart from each other by the same gap distance. In another embodiment, at least one of the plurality of plasma source electrodes 114 and at least one of the plurality of protruding portions 170 may have various shape as necessary.

The plurality of plasma source electrodes 114, the plurality of protruding portions 170, the chamber lid 112a, the chamber body 112b and the susceptor 116 may be formed of a metallic material such as aluminum and stainless steel, and the plurality of insulating plates 162 may be formed of a ceramic material such as aluminum oxide.

The gas distributing means 118 is formed in each of the plurality of plasma source electrodes 114 and the plurality of protruding portions 170. The gas distributing means 118 includes a plurality of first gas distributing means 118a respectively in the plurality of plasma source electrodes 114 and a plurality of second gas distributing means 118b respectively in the plurality of protruding electrodes 170. The plurality of first gas distributing means 118a spray a first process gas and the plurality of second gas distributing means 118b spray a second process gas. The first and second process gases may be the same as each other or may be different from each other.

Although the plurality of first gas distributing means 118a are formed in the plurality of plasma source electrodes 114 and the plurality of second gas distributing means 170 are formed in the plurality of protruding portions 170 in FIG. 1, the gas distributing means 118 may be formed exclusively in the plurality of plasma source electrodes 114 or exclusively in the plurality of protruding portions 170 in another embodiment. Further, when the gas distributing means 118 is formed in the plurality of plasma source electrodes 114, the plurality of protruding portions 170 may be omitted.

The edge frame 120 is formed on an inner wall of the process chamber 112 and extends over a periphery of the substrate 164. When the susceptor 116 moves up to be located at a process position, the edge frame 220 blocks the periphery of the substrate 164 to prevent formation of a thin film on the periphery of the substrate 164. The edge frame 120 has an electrically floating state.

A reaction gas in the reaction space is outputted through the exhaust port 124 so that a vacuum state of the reaction space can be controlled. A vacuum pump (not shown) may be connected to the exhaust port 124.

Figure 2:
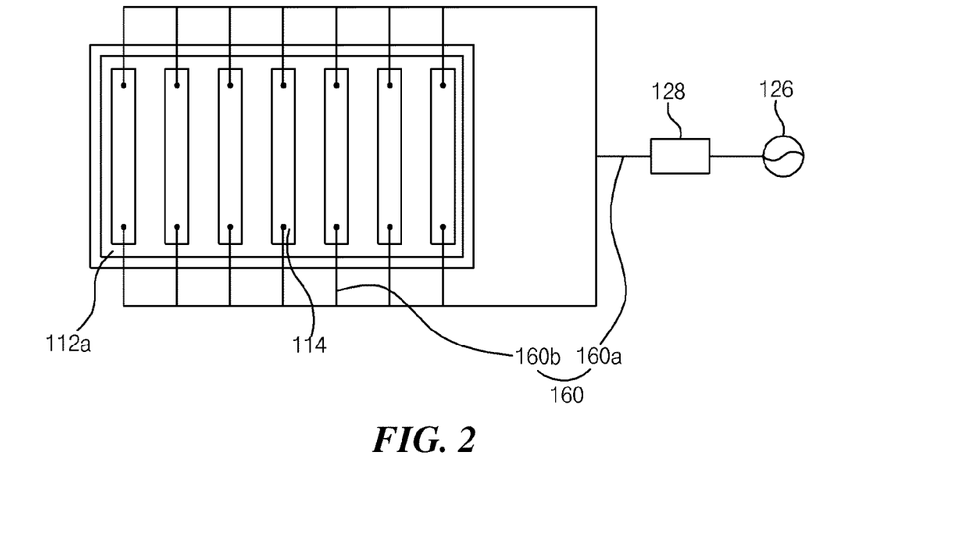
FIG. 2 is a plan view showing a plasma source electrode of a substrate processing apparatus according to an embodiment of the present invention.

FIG. 2 is a plan view showing a plasma source electrode of a substrate processing apparatus according to an embodiment of the present invention.

In FIG. 2, the plurality of plasma source electrodes 114 are disposed to be parallel to and spaced apart from each other. In addition, the plurality of plasma source electrodes 114 are connected in parallel to the RF power source 126 through the feeding line 160. The matcher 128 for impedance matching is connected between the feeding line 160 and the RF power source 126. The feeding line 160 includes the main feeding line 160a connected to the RF power source 126 and the plurality of auxiliary feeding lines 160b connect the main feeding line 160a and both ends of the plurality of plasma source electrodes 114.

Figure 3:
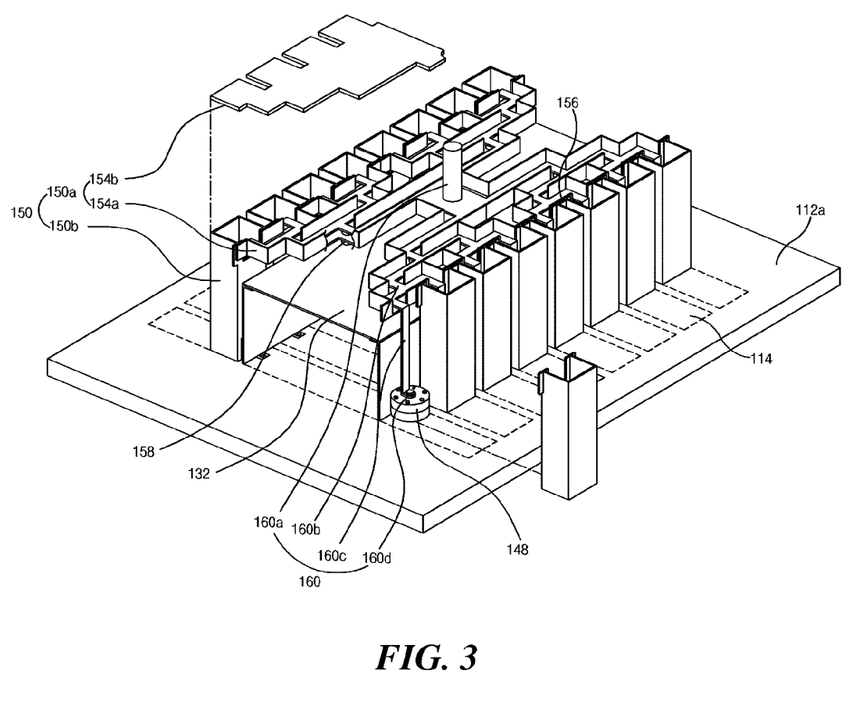
FIG. 3 is a perspective view showing a power supplying means according to an embodiment of the present invention.

FIG. 3 is a perspective view showing a power supplying means according to an embodiment of the present invention.

In FIG. 3, the feeding line 160 and the shielding means 150 are formed on an outer surface of the chamber lid 112a corresponding to the exterior of the process chamber 112 (of FIG. 1). For convenience of illustration, the gas inlet pipe 172 of FIG. 1 is omitted and the plurality of plasma source electrodes 114 combined to an inner surface of the chamber lid 112a corresponding to the interior of the process chamber 112 are shown in dotted line. In addition, a housing 132 accommodating the gas inlet pipe (of FIG. 1) is formed on the outer surface of the chamber lid 112a.

The power supplying means 122 includes the RF power source 126 (of FIG. 1), the matcher 130 (of FIG. 1), the feeding line 160 connected to the plurality of plasma source electrodes 114, the shielding means 150 electrically shielding the feeding line 160 and a supporting means 158 supporting the feeding line 160.

The feeding line 160 includes the main feeding line 160a connected to the RF power source 126 (of FIG. 1), the plurality of auxiliary feeding lines 160b connected to the main feeding line 160a, a plurality of connecting lines 160c connected to the plurality of auxiliary feeding lines 160b and a plurality of feeding rods 160d connecting the plurality of connecting lines 160c and the plurality of plasma source electrodes 114. The plurality of auxiliary feeding lines 160b may be symmetrically disposed with respect to first and second horizontal reference lines passing the main feeding line 160a. The first and second horizontal reference lines are perpendicular to each other and perpendicular to the main feeding line 160a. When the plurality of auxiliary feeding lines 160b are symmetrically formed, the RF power may be further uniformly applied to the plurality of plasma source electrodes 114.

When the plasma is discharged in the process chamber 112 by applying the RF power to the plurality of plasma source electrodes 114, electric interference may be caused among the plurality of auxiliary feeding lines 160b and among the plurality of connecting lines 160c connected to the plasma source electrodes 114. Accordingly, it may be difficult to obtain a uniform electric field distribution over the substrate 164 (of FIG. 1) corresponding to the plurality of plasma source electrodes 114. In addition, the plasma may be non-uniformly distributed in the reaction space of the process chamber 112 due to the non-uniform electric field distribution. As a result, the non-uniform plasma distribution may degrade the uniform deposition of a thin film or the uniform etching of a thin film.

For the purpose of preventing the electric interference among the plurality of auxiliary feeding lines 160b and among the plurality of connecting lines 160c, the shielding means 150 is formed to wrap the feeding line 160. The shielding means 150 includes a first shielding cover 150a and a plurality of second shielding covers 150b. The first shielding cover 150a shields the plurality of auxiliary feeding lines 160b, and the plurality of second shielding covers 150b shield the plurality of connecting lines 160c.

To shield the plurality of auxiliary feeding lines 160b parallel to the chamber lid 112a with ease, a region where the plurality of auxiliary feeding lines 160b are disposed may be divided into a plurality of shielding regions and the first shielding cover 150a may include a plurality of first shielding covers 150a. When the plurality of first shielding covers 150a are used, the region for the plurality of auxiliary feeding lines 160b may be divided into four shielding regions with respect to the first and second horizontal reference lines passing the main feeding line 160a and four first shielding covers 150a may be used for the four shielding regions so that the four first shielding covers 150a can be assembled with ease. The number of the first shielding covers 150a may vary according to the division number and the area of the plurality of auxiliary feeding lines 160b.

The first shielding cover 150a includes a lower piece 154a under the plurality of auxiliary feeding lines 160b and an upper piece 154b over the plurality of auxiliary feeding lines 160b. The lower and upper pieces 154a and 154b are combined to each other to wrap the plurality of auxiliary feeding lines 160b. The plurality of second shielding covers are disposed over the upper surface of the chamber lid 112a and are combined to the lower piece 154a of the first shielding cover 150a to shield the plurality of connecting lines 160c and the plurality of feeding rods 160d. The chamber lid 112a contacts and supports the plurality of second shielding covers 150b. The plurality of second shielding covers 150b may be not combined to the chamber lid 112a.

The upper piece 154b of the first shielding cover 150a covers an open portion formed by the lower piece 154a and the plurality of second shielding covers 150b. Accordingly, a planar area of the lower piece 154a is smaller than a planar area of the upper piece 154b.

The first shielding cover 150a and the plurality of second shielding covers 150b may be formed of a metallic material such as aluminum. When the first shielding cover 150a and the plurality of second shielding covers 150b are assembled for shielding the feeding line 160, the first shielding cover 150a and the plurality of second shielding covers 150b are electrically connected to each other. In addition, the shielding means 150 including the first shielding cover 150a and the plurality of second shielding covers 150b is electrically connected to the chamber lid 112a to be grounded. At least one ground line 156 connected to the chamber lid 112a may be formed between two adjacent second shielding covers 150b for increasing ground paths from the shielding means 150.

The plurality of second shielding covers 150b may be disposed in two symmetrical rows with respect to the second horizontal reference line that passes the main feeding line 160a and is perpendicular to a longer axis of each of the plurality of plasma source electrodes 114. In addition, the plurality of connecting lines 160c and the plurality of feeding rods 160d connected to both ends of each plasma source electrode 114 may be disposed in two symmetrical rows with respect to the second horizontal reference line. The at least one ground line 156 may be formed between two adjacent second shielding covers 150b in each symmetrical row.

Figure 4:
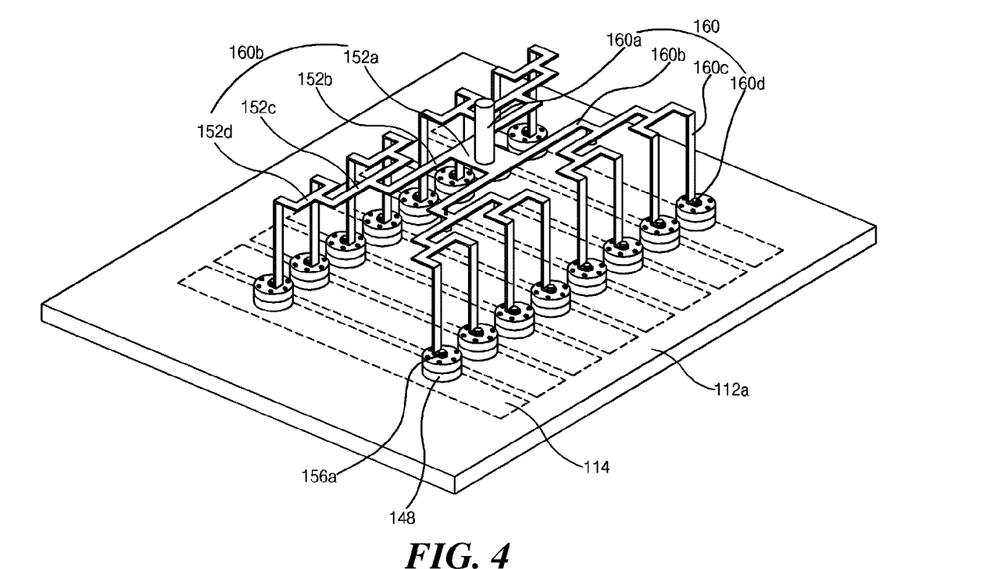
FIG. 4 is a perspective view showing a feeding line of a power supplying means according to an embodiment of the present invention.

FIG. 4 is a perspective view showing a feeding line of a power supplying means according to an embodiment of the present invention.

In FIG. 4, the gas inlet pipe 172 of FIG. 1 is omitted, and the plurality of plasma source electrodes 114 combined to an inner surface of the chamber lid 112a corresponding to the interior of the process chamber 112 (of FIG. 1) are shown in dotted line for convenience of illustration.

The feeding line 160 includes the main feeding line 160a, the plurality of auxiliary feeding lines 160b, the plurality of connecting lines 160c and the plurality of feeding rods 160d. One end of the main feeding line 160a is connected to the RF power source 126 (of FIG. 1) and is formed to be perpendicular to the chamber lid 112a. The other end of the main feeding line 160a is connected to the plurality of auxiliary feeding lines 160b parallel to the chamber lid 112a. The main feeding line 160a is divided into the plurality of auxiliary feeding lines 160b so that the RF power can be uniformly applied to the plurality of plasma source electrodes 114.

The plurality of auxiliary feeding lines 160b include a plurality of first branch lines 152a connected to the main feeding line 160a, a plurality of second branch lines 152b respectively connected to the plurality of first branch lines 152a, a plurality of third branch lines 152c respectively connected to the plurality of second branch lines 152b and a plurality of fourth branch lines 152d respectively connected to the plurality of third branch lines 152c. The number of branch lines of the plurality of auxiliary feeding lines 160b may vary as necessary.

The plurality of first branch lines 152a, the plurality of second branch lines 152b, the plurality of third branch lines 152c and the plurality of fourth branch lines 152d are disposed to be parallel to the chamber lid 112a. The plurality of connecting lines 160c are connected to the plurality of fourth branch lines 152d, respectively. The plurality of first branch lines 152a, the plurality of second branch lines 152b, the plurality of third branch lines 152c, the plurality of fourth branch lines 152d and the plurality of connecting lines 160c may have a plate shape. The plurality of connecting lines 160c are perpendicular to the chamber lid 112a and are respectively connected to the plasma source electrodes 114 with the plurality of feeding rods 160d interposed therebetween.

A connecting plate 156a expanding parallel to the chamber lid 112a is formed at an end of each of the plurality of connecting lines 160c for connection to the plurality of feeding rods 160d. A penetration hole is formed in the connecting plate 156a. Each of the plurality of feeding rods 160d may penetrate the connecting plate 156a through the penetration hole and an upper end of each of the plurality of feeding rods 160d is supported by the connecting plate 156a. The plurality of feeding rods 160d penetrate the connecting plate 156a and an airtight plate 148 and are combined to the plurality of plasma source electrodes 114. The connecting plate 156a directly contacts the airtight plate 148. In addition, a screw thread may be formed at a lower end of each of the plurality of feeding rods 160d for combination to the plurality of plasma source electrodes 114.

Figure 5:
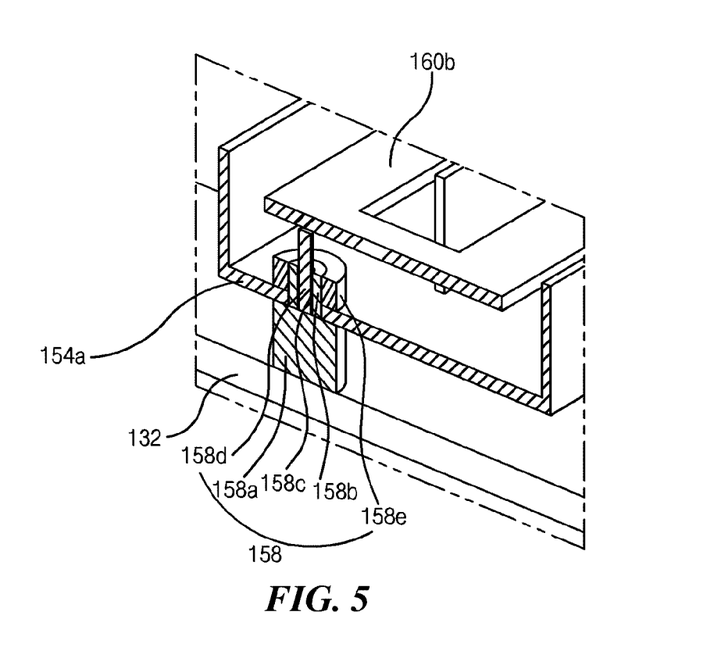
FIG. 5 is a cross-sectional perspective view showing a supporting means of a power supplying means according to an embodiment of the present invention.

FIG. 5 is a cross-sectional perspective view showing a supporting means of a power supplying means according to an embodiment of the present invention.

In FIG. 5, the supporting means 158 may be formed to be plural in number for supporting the plurality of auxiliary feeding lines 160b. The supporting means 158 is disposed over the housing 132 and penetrates the lower piece 154a of the first shielding cover 160a. The supporting means 158 supports the plurality of auxiliary feeding lines 160b parallel to the chamber lid 112a for preventing the plurality of auxiliary feeding lines from sagging.

The supporting means 158 includes a supporting body 158a that is disposed over the housing 132 and has a cylindrical shell shape, a protruding connector 158b that is connected to the supporting body 158a and penetrates the lower piece 154a of the first shielding cover 160a, a combination hole 158c that is formed at a center of the protruding connector 158b, a supporting rod 158d that is inserted through the combination hole 158c and supports the plurality of auxiliary feeding lines 160b and a coupling part 158e that is combined to the protruding connector 158b.

The protruding connector 158b having a cylindrical shape has a radius smaller than the supporting body 158a. A screw thread is formed on an inner surface of the protruding connector 158b and on an outer surface of the supporting rod 158d so that the protruding connector 158b and the supporting rod 158d can be combined to each other in screw connection. The coupling part 158e has a hollow hole accommodating the protruding connector 158b. The supporting body 158a, the protruding connector 158b and the coupling part 158e may be formed of an insulating material such as Teflon, and the supporting rod 158d may be formed of a metallic material such as copper (Cu).

Figure 6:
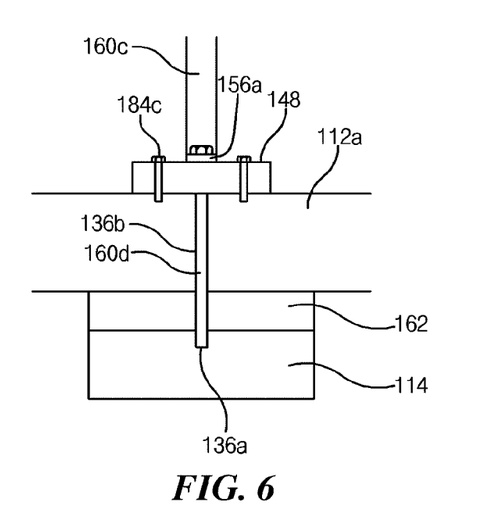
FIG. 6 is a cross-sectional view showing a feeding line and a plasma source electrode of a substrate processing apparatus according to an embodiment of the present invention.

FIG. 6 is a cross-sectional view showing a feeding line and a plasma source electrode of a substrate processing apparatus according to an embodiment of the present invention.

In FIG. 6, a coupling hole 136a is formed in the plasma source electrode 114 and an inlet hole 136b is formed in the chamber lid 112a and the insulating plate 162 so that the feeding rods 160d can be electrically connected to both ends of the plasma source electrode 114. The feeding rod 160d is inserted through the hollow hole of the connecting plate 156a at the end of the plurality of connecting lines 160c, the inlet hole 136b and the coupling hole 136a and is combined to the plasma source electrode 114. When the feeding rod 160d is combined to the plasma source electrode 114, an insulator is formed in the inlet hole 136b corresponding to the chamber lid 112a for electrically isolating the feeding rod 160d and the chamber lid 112a.

For the purpose of electrically connecting the feeding rod 160d and the plasma source electrode 114 with airtight kept, the airtight plate 148 is combined to the chamber lid 112a corresponding to the plasma source electrode 114 using a bolt 184 with an O-ring (not shown) interposed therebetween. A screw thread is formed at the coupling hole 136a of the plasma source electrode 114 and on an end of the feeding rod 160d so that the feeding rod 160d and the plasma source electrode 114 can be combined to each other in screw thread. The airtight plate 148 may be formed of an insulating material as ceramic.

Figure 7:
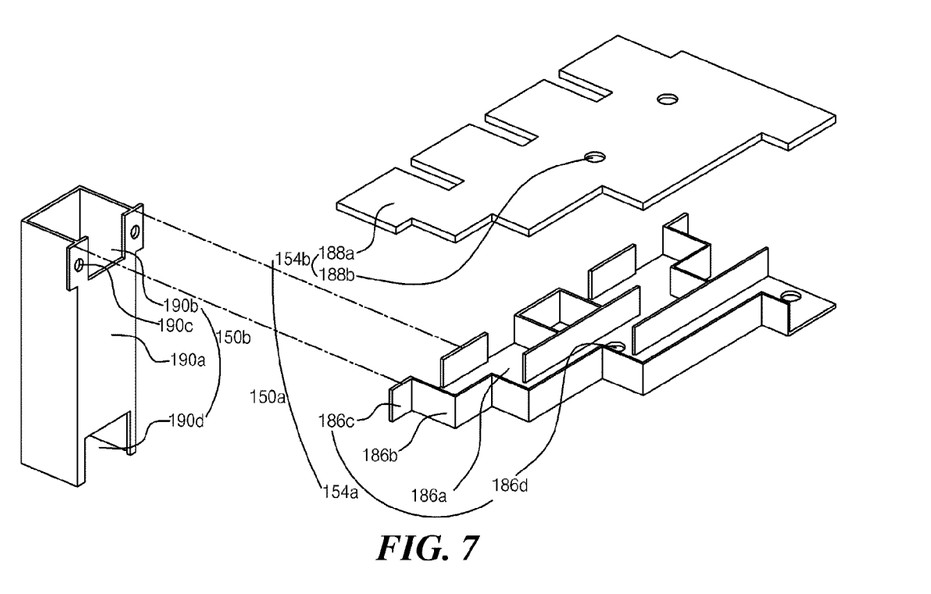
FIG. 7 is an exploded perspective view showing a shielding means of a power supplying means according to an embodiment of the present invention.

FIG. 7 is an exploded perspective view showing a shielding means of a power supplying means according to an embodiment of the present invention.

In FIG. 7, the shielding means 150 includes the first shielding cover 150a shielding the plurality of auxiliary feeding lines 160b (of FIG. 3) and the plurality of second shielding covers 150b shielding the plurality of connecting lines 160c (of FIG. 3).

The first shielding cover 150a includes the lower and upper pieces 154a and 154b combined to each other. The lower piece 154a includes a first accommodating portion 186a which the feeding line 160 (of FIG. 3) is disposed over, a fence portion 186b formed along a perimeter of the first accommodating portion 186a, a first connecting portion 186c combined to the plurality of second shielding covers 150b and a through hole 186d which the supporting means 158 penetrates through. The upper piece 154b includes a plate portion 188a which the feeding line 160 is disposed under and a plurality of circulation holes 188b connected to a circulating means (not shown) for exhausting a heat radiated from the feeding line 160.

Each of the plurality of second shielding covers 150b includes a pipe 190a which has a rectangular pillar shell shape including a hollow hole accommodating the plurality of connecting lines 160c, a passing portion 190b which the plurality of fourth branch lines 152d (of FIG. 4) penetrate through, a second connecting portion 190c at both sides of the passing portion 190b combined to the lower piece 154a and a communicating portion 190d. The passing portion 190b is formed by eliminating an upper portion of the pipe 190a and the communicating portion 190d is formed by eliminating a lower portion of the pipe 190a. In addition, the second connecting portion 190c of each of the plurality of second shielding covers 150b corresponds to the first connecting portion 186c of the lower piece 154a of the first shielding cover 150a.

The lower piece 154a of the first shielding cover 150a is combined to the plurality of second shielding covers 150b, and the open portion formed by the lower piece 154a of the first shielding cover 150a and the plurality of second shielding covers 150b is covered with the upper piece 154b of the first shielding cover 150a. Accordingly, the upper piece 154b has a planar area greater than the lower piece 154a.

Figure 8:
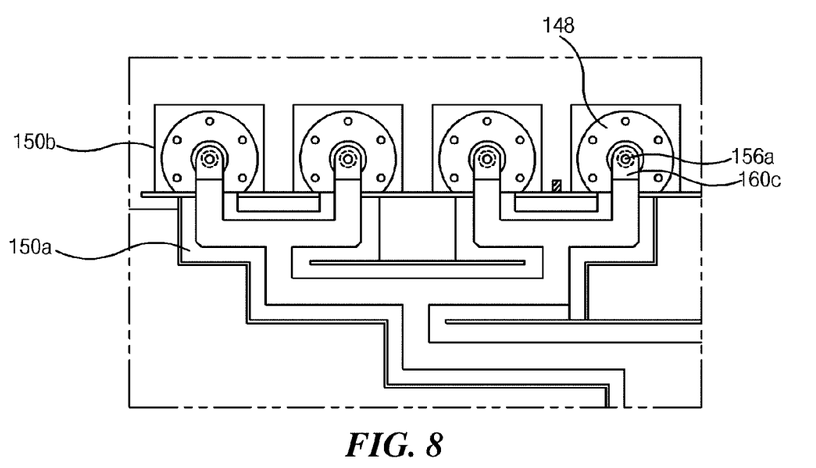
FIG. 8 is a plan view showing a power supplying means according to an embodiment of the present invention.

FIG. 8 is a plan view showing a power supplying means according to an embodiment of the present invention.

In FIG. 8, the upper piece 154b of the first shielding means 150a is omitted, and the plurality of auxiliary feeding lines 160b, the lower piece 154a of the first shielding means 150a and the plurality of second shielding means 150b are shown for convenience of illustration.

Each of the plurality of connecting lines 160c adjacent to the first shielding cover 150a penetrates through the hollow hole of each of the plurality of second shielding covers 150b. The connecting plate 156a, which is connected to the end of each of the plurality of connecting lines 160c and expands parallel to the first shielding cover 150a, is disposed at a central portion of each of the plurality of second covers 150b. The connecting plate 156a of each of the plurality of second shielding covers 150b and each of the plurality of plasma source electrodes 114 (of FIG. 6) are connected to each other through each of the plurality of feeding rods 160d (of FIG. 6). In addition, the hollow hole of each of the plurality of second shielding covers 150b has a size capable of accommodating the airtight plate 148 that is used for keeping airtight when the feeding rod 160d and the plasma source electrodes 114 are connected to each other. The airtight plate 148 may protrude outside each of the plurality of second shielding covers 150b through the communicating portion 190d.

Figure 9:
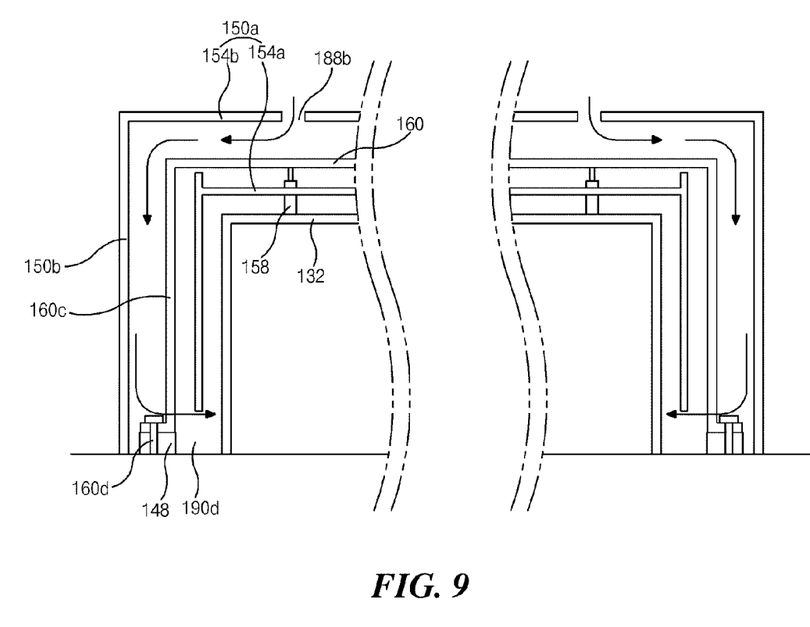
FIG. 9 is a cross-sectional view showing a power supplying means according to an embodiment of the present invention.

FIG. 9 is a cross-sectional view showing a power supplying means according to an embodiment of the present invention.

In FIG. 9, when the shielding means 150 is assembled for shielding the feeding line 160, a circulation space is defined between the feeding line 160 and the shielding means 150. When the RF power is applied to the plurality of plasma source electrodes 114 (of FIG. 1) through the feeding line 160, a heat is radiated from the feeding line 160. For the purpose of preventing accumulation of the heat in the circulation space between the feeding line 160 and the shielding means 150, the plurality of circulation holes 188b are formed in the upper piece 154b of the first shielding means 150a and a circulating means such as a fan (not shown) injecting external air into or through the plurality of circulation holes 188b is connected to the upper piece 154b. The air injected through the plurality of circulation holes 188b is circulated through the circulation space between the feeding line 160 and the shielding means 150 and is exhausted through the communicating portion 190d of each of the plurality of second shielding covers 150b.

Figure 10:
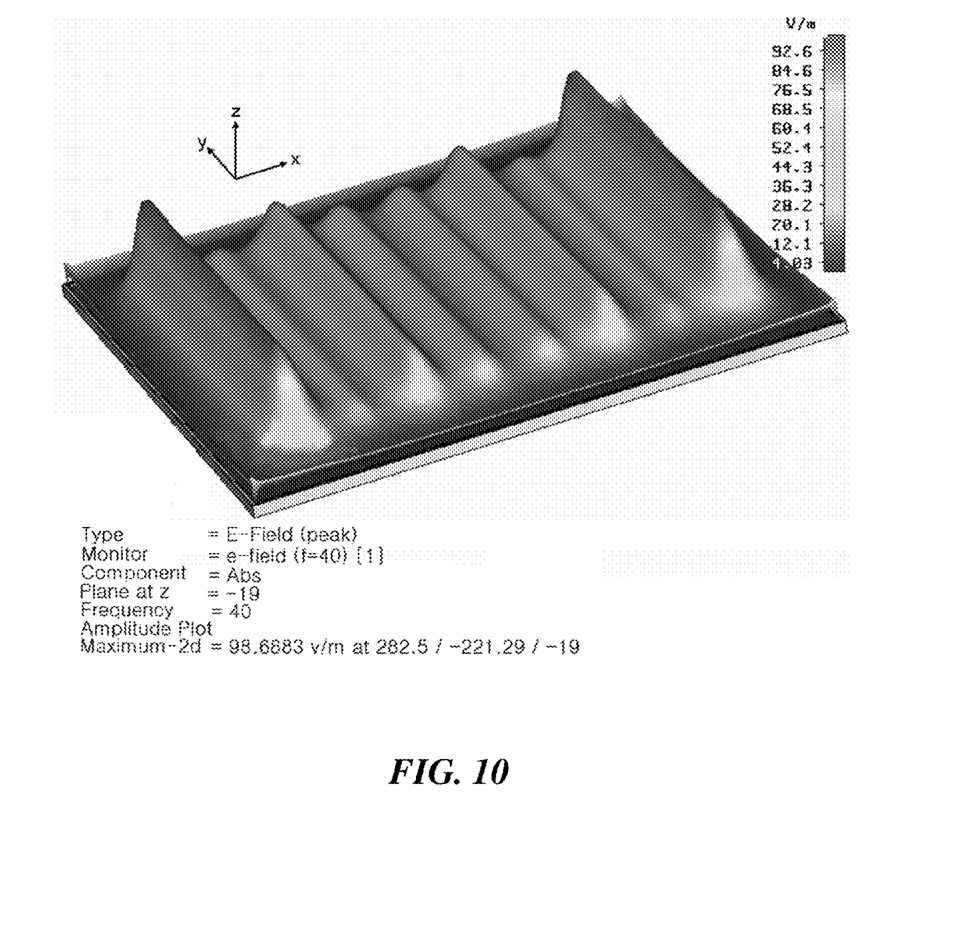
FIGS. 10 and 11 are graphs showing an electric field in a power supplying means without a shielding means.
Figure 11:
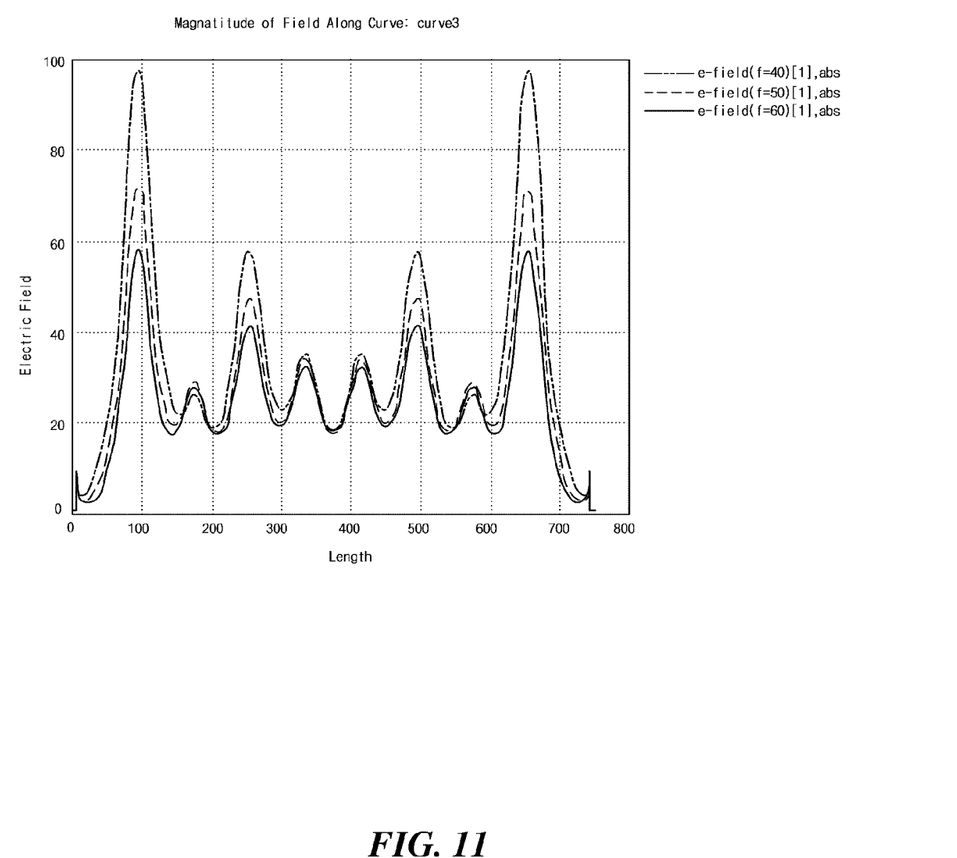
Figure 12:
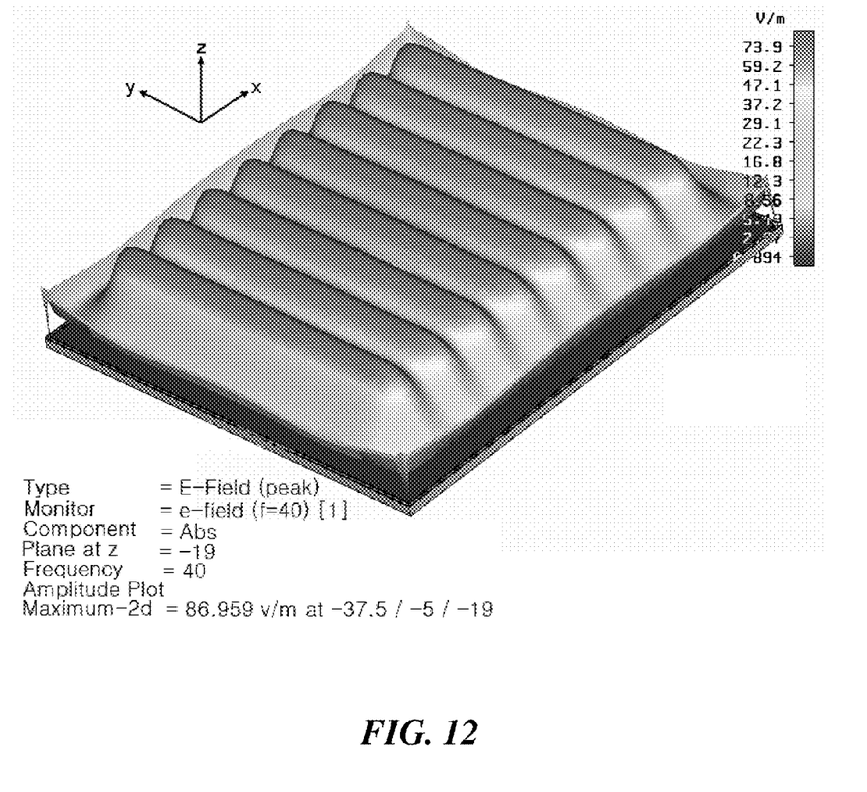
FIGS. 12 and 13 are graphs showing an electric field in a power supplying means having a shielding means according to an embodiment of the present invention.
Figure 13:
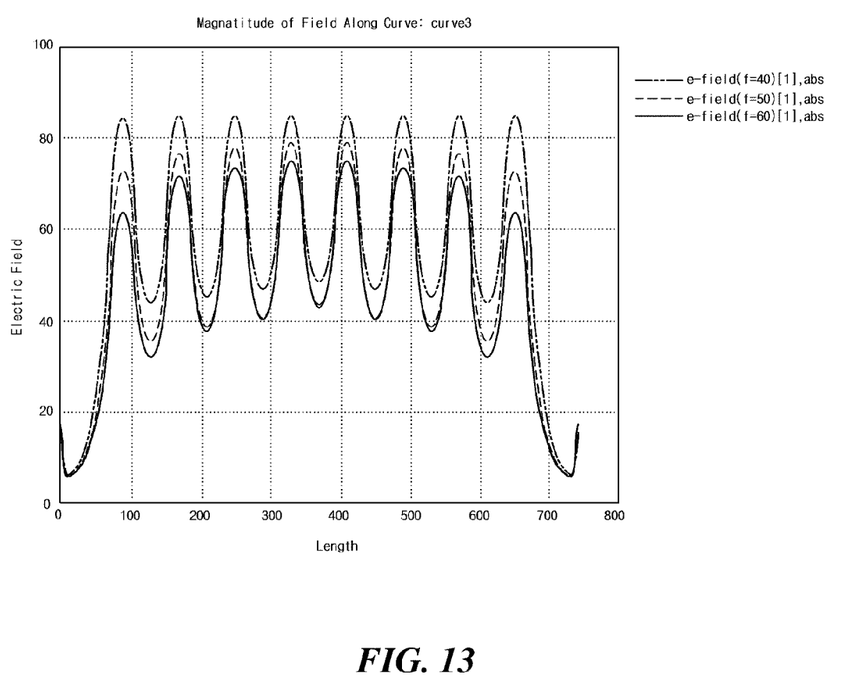

FIGS. 10 and 11 are graphs showing an electric field in a power supplying means without a shielding means, and FIGS. 12 and 13 are graphs showing an electric field in a power supplying means having a shielding means according to an embodiment of the present invention. FIGS. 10 to 13 show a simulation result where a variation in electric field distribution according to with or without a shielding means is predicted.

In FIGS. 10 and 12, an x-axis represents a position along a shorter axis of the plasma source electrode 114 (of FIG. 2), a y-axis represents a position along a longer axis of the plasma source electrode 114 (of FIG. 2) and a z-axis represents an electric field intensity in voltage per meter (V/m). In addition, the electric field intensity increases as the color becomes bright, and the electric field intensity decreases as the color becomes dark.

In FIGS. 11 and 13, an x-axis represents a position along a shorter axis of the plasma source electrode (of FIG. 2) and a y-axis represents an electric field intensity. In addition, variations in electric field distribution according to an RF power are calculated.

When the feeding line is not wrapped by the shielding means, the electric field has non-uniform peaks as shown in FIGS. 10 and 11. As a result, it becomes difficult to process the substrate uniformly due to the non-uniform peaks of the electric field. When the feeding line is wrapped by the shielding means, the electric field has uniform peaks as shown in FIGS. 12 and 13. As a result, the substrate is uniformly processed with the electric field having uniform peaks.

Consequently, in a substrate processing apparatus according to the present invention, since a shielding means wraps a feeding line connecting an RF power source and a plasma source electrode, transmission of an electric field from the feeding line to an exterior or from the exterior to the feeding line is prevented. In addition, since interference in an electric field is prevented, a uniform plasma density is obtained in a reaction space and the substrate is uniformly processed.

Further, when an RF power is applied to a plasma source electrode through a feeding line, a heat radiated from the feeding line may be accumulated in a circulation space between the feeding line and a shielding means and the accumulated heat may deteriorate the RF power applied to the plasma source electrode. Since an air in the circulation space is exhausted by a circulating means, the heat accumulation in the circulation space is prevented.

It will be apparent to those skilled in the art that various modifications and variations can be made in a power supplying means having a shielding means and a substrate processing apparatus including the power supplying means of the present invention without departing from the spirit or scope of the invention. Thus, it is intended that the present invention cover the modifications and variations of this invention provided they come within the scope of the appended claims and their equivalents.

What is claimed is:

1. A substrate processing apparatus, comprising:
a process chamber including a chamber lid and a chamber body to provide a reaction space therein;
a source electrode in the process chamber;
a radio frequency (RF) power source for supplying an RF power to the source electrode;
a feeding line connecting the source electrode and the RF power source; and
a shielding part wrapping the feeding line to block an electric field,
wherein the source electrode includes a plurality of plasma source electrodes coupled to the chamber lid, and wherein the plurality of plasma source electrodes are connected in parallel to the RF power source,
wherein the feeding line comprises:
a main feeding line connected to the RF power source;
a plurality of auxiliary feeding lines connected to the main feeding line;
a plurality of connecting lines connected to the plurality of auxiliary feeding lines; and
a plurality of feeding rods connecting the plurality of connecting lines and the plurality of plasma source electrodes,
wherein the shielding part comprises:
a first shielding cover shielding the plurality of auxiliary feeding lines; and
a plurality of second shielding covers shielding the plurality of connecting lines and the plurality of feeding rod,
wherein the first shielding cover includes lower and upper pieces combined to each other, and
wherein the lower piece is disposed under the plurality of auxiliary feeding lines and the upper piece is disposed over the plurality of auxiliary feeding lines,
wherein the lower piece is disposed under the plurality of auxiliary feeding lines and the upper piece is disposed over the plurality of auxiliary feeding lines,
wherein the lower piece comprises:
a first accommodating portion which the plurality of auxiliary feeding lines are disposed over;
a fence portion formed along a perimeter of the first accommodating portion;
a first connecting portion coupled to the plurality of second shielding covers; and
a through hole which a support supporting the plurality of auxiliary feeding lines penetrates through,
wherein the upper piece comprises:
a plate portion which the plurality of auxiliary feeding lines are disposed under; and
a circulation hole connected to an air circulating device means,
wherein at least one of the plurality of second shielding covers comprises:
a pipe including a hollow hole accommodating the plurality of connecting lines;
a passing portion formed by eliminating an upper portion of the pipe;
a second connecting portion at both sides of the passing portion and coupled to the first shielding cover; and a communicating portion formed by eliminating a lower portion of the pipe,
wherein the shielding part forms a common air circulation space for air to be circulated through and about the plurality of auxiliary feeding lines, the plurality of connecting lines and the plurality of feeding rods; and the shielding part is configured to prevent transmission of an electric field between the feeding line and an exterior to obtain a substantially uniform plasma density at a reaction space.

2. The substrate processing apparatus according to claim 1, wherein the air circulating device for circulating air in the common air circulation space comprises a fan.

3. The substrate processing apparatus according to claim 1, further comprising a ground line connecting the shielding part and the chamber lid.

4. The substrate processing apparatus according to claim 1, wherein the plurality of feeding rods are disposed in two symmetrical rows with respect to a horizontal reference line that passes the main feeding line.

5. The substrate processing apparatus according to claim 4, wherein the plurality of feeding rods are substantially perpendicular to a longer axis of at least one of the plurality of plasma source electrodes so that the plurality of feeding rods can be connected to both ends of at least one of the plurality of plasma source electrodes.

6. The substrate processing apparatus according to claim 1, wherein the main feeding line and the plurality of connecting lines are substantially perpendicular to the chamber lid.

7. The substrate processing apparatus according to claim 6, wherein the plurality of auxiliary feeding lines are substantially parallel to the chamber lid.

8. The substrate processing apparatus according to claim 7, further comprising a plurality of supports supporting the plurality of auxiliary feeding lines.

9. The substrate processing apparatus according to claim 1, wherein the first shielding cover is divided into a plurality of first shielding covers and the plurality of first shielding covers are assembled to shield the plurality of auxiliary feeding lines.

10. The substrate processing apparatus according to claim 1, wherein the plurality of auxiliary feeding lines include a plurality of first branch lines connected to the main feeding line, a plurality of second branch lines respectively connected to the plurality of first branch lines, a plurality of third branch lines respectively connected to the plurality of second branch lines and a plurality of fourth branch lines respectively connected to the plurality of third branch lines; and the plurality of connecting lines are connected to the plurality of fourth branch lines, respectively.

11. A power supplying device for supplying a radio frequency (RF) power to a source electrode in a process chamber, the device comprising:
an RF power source configured to supply the RF power to the source electrode;
a feeding line connecting the source electrode and the RF power source; and
a shielding part shielding the feeding line to block an electric field,
wherein the source electrode includes a plurality of plasma source electrodes connected in parallel to the RF power source,
wherein the feeding line comprises:
a main feeding line connected to the RF power source;
a plurality of auxiliary feeding lines connected to the main feeding line;
a plurality of connecting lines connected to the plurality of auxiliary feeding lines; and a plurality of feeding rods connecting the plurality of connecting lines and the plurality of plasma source electrodes, wherein the shielding part comprises:
- a first shielding cover shielding the plurality of auxiliary feeding lines; and
- a plurality of second shielding covers shielding the plurality of connecting lines and the plurality of feeding rod, wherein the first shielding cover includes lower and upper pieces combined to each other, and wherein the lower piece is disposed under the plurality of auxiliary feeding lines and the upper piece is disposed over the plurality of auxiliary feeding lines, wherein the lower piece comprises:
- a first accommodating portion which the plurality of auxiliary feeding lines are disposed over;
- a fence portion formed along a perimeter of the first accommodating portion;
- a first connecting portion coupled to the plurality of second shielding covers; and
- a through hole which a support supporting the plurality of auxiliary feeding lines penetrates through, wherein the upper piece comprises:
- a plate portion; and
- a circulation hole connected to an air circulating device, wherein at least one of the plurality of second shielding covers comprises:
- a pipe including a hollow hole accommodating the plurality of connecting lines;
- a passing portion formed by eliminating an upper portion of the pipe;
- a second connecting portion at both sides of the passing portion and coupled to the first shielding cover; and
- a communicating portion formed by eliminating a lower portion of the pipe wherein the shielding part forms a common air circulation space for air to be circulated through and about the plurality of auxiliary feeding lines, the plurality of connecting lines and the plurality of feeding rods, and the shielding part is configured to prevent transmission of an electric field between the feeding line and an exterior to obtain a substantially uniform plasma density at a reaction space.

12. The power supplying device according to claim 11, wherein the air circulating device for circulating air in the common air circulation space comprises a fan.

13. The power supplying device according to claim 12, wherein the air is injected through a plurality of circulation holes formed in the shielding part such that the injected air is circulated through the common air circulation space.

14. The power supplying device according to claim 11, wherein the plurality of auxiliary feeding lines include a plurality of first branch lines connected to the main feeding line, a plurality of second branch lines respectively connected to the plurality of first branch lines, a plurality of third branch lines respectively connected to the plurality of second branch lines and a plurality of fourth branch lines respectively connected to the plurality of third branch lines; and the plurality of connecting lines are connected to the plurality of fourth branch lines, respectively.

* * * * *